(12) United States Patent
Lin et al.

(10) Patent No.: US 9,793,258 B1
(45) Date of Patent: Oct. 17, 2017

(54) ELECTROSTATIC DISCHARGE DEVICE

(71) Applicant: United Microelectronics Corp., Hsinchu (TW)

(72) Inventors: Cheng-Te Lin, Kaohsiung (TW); Li-Cih Wang, Taoyuan (TW); Tien-Hao Tang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/344,212

(22) Filed: Nov. 4, 2016

(51) Int. Cl.
*H01L 27/02* (2006.01)

(52) U.S. Cl.
CPC ...... *H01L 27/0266* (2013.01); *H01L 27/0259* (2013.01); *H01L 27/0288* (2013.01)

(58) Field of Classification Search
CPC ............. H01L 27/0266; H01L 27/0259; H01L 27/0288
See application file for complete search history.

(56) References Cited

U.S. PATENT DOCUMENTS

| | | | | |
|---|---|---|---|---|
| 5,581,103 A | * | 12/1996 | Mizukami | H01L 27/0266 257/355 |
| 5,708,610 A | * | 1/1998 | Okasaka | G11C 5/14 365/189.06 |
| 5,905,679 A | * | 5/1999 | Tsukikawa | H01L 27/0928 257/355 |
| 7,372,083 B2 | * | 5/2008 | Lee | H01L 27/0262 257/173 |
| 7,719,806 B1 | * | 5/2010 | Boyd | H01L 27/027 361/56 |
| 7,939,905 B2 | | 5/2011 | Nagai | |
| 9,006,782 B2 | | 4/2015 | Salcedo | |
| 9,368,486 B2 | | 6/2016 | Wang et al. | |
| 2002/0043687 A1 | * | 4/2002 | Tsuji | H01L 27/0255 257/355 |
| 2005/0133870 A1 | * | 6/2005 | Manna | H01L 27/0259 257/355 |
| 2014/0346563 A1 | | 11/2014 | Salcedo et al. | |

FOREIGN PATENT DOCUMENTS

| | | |
|---|---|---|
| CN | 101097916 | 4/2011 |
| CN | 103730458 | 4/2014 |
| CN | 104716132 | 6/2015 |

* cited by examiner

*Primary Examiner* — Karen Kusumakar
(74) *Attorney, Agent, or Firm* — J.C. Patents

(57) ABSTRACT

An electrostatic discharge device includes a substrate. A deep doped well of a first conductive type is disposed in the substrate. A drain doped well of the first conductive type is disposed in the substrate above the deep doped well. An inserted doping well of a second conductive type is disposed in the drain doped well, in contact with the deep doped well. A drain region of the first conductive type is in the drain doped well and above the inserted doping well. An inserted drain of the second conductive type is on the inserted doping well and surrounded by the drain region. A source doped well of the second conductive type is disposed in the substrate, abut the drain doped well. A source region is disposed in the source doped well. A gate structure is disposed on the substrate between the drain region and the source region.

18 Claims, 10 Drawing Sheets

ELECTROSTATIC DISCHARGE DEVICE

BACKGROUND OF THE INVENTION

1. Field of the Invention

The present invention generally relates to semiconductor fabrication, in particular, to an electrostatic discharge (ESD) device.

2. Description of Related Art

ESD devices have been used in an integrated circuit to connect between input/output terminal and the system power source VDD/VSS, so to avoid the discharged current to flow into the internal circuit. In various situations, the electronic apparatus with the integrated circuit is operated at high voltage, which is for example in a range of 20V to 100V. The integrated circuit has also been developed for operation at high voltage. Then, the protection of circuit from the ESD current then needs more consideration in design.

The ESD device usually is a mechanism of silicon control rectifier (SCR), which would be triggered in conducting state when an ESD current enters the input/output terminal, which is also connected to the ESD device. Due to the conducting state of the ESD device, the ESD current would be led to the system power source, such as the ground voltage (VSS) without entering the internal circuit.

However, when the trigger voltage of the ESD device is higher than the maximum operation voltage level of the internal circuit device, such as the output driver, the ESD device may not be triggered before the output driver is damaged. As a result, the protection capability of the ESD device would get fail.

The design of ESD device to reduce the trigger voltage, particularly to the high voltage ESD device as an example, is still under developing.

SUMMARY OF THE INVENTION

The invention is directed to ESD device, which is more sensitive to the ESD current, so to effectively reduce the trigger voltage of the ESD device.

In an embodiment of the invention, an electrostatic discharge device includes a substrate. A deep doped well of a first conductive type is disposed in the substrate. A drain doped well of the first conductive type is disposed in the substrate above the deep doped well. An inserted doping well of a second conductive type is disposed in the drain doped well, in contact with the deep doped well. A drain region of the first conductive type is in the drain doped well and above the inserted doping well. An inserted drain of the second conductive type is on the inserted doping well and surrounded by the drain region. A source doped well of the second conductive type is disposed in the substrate, abut the drain doped well. A source region is disposed in the source doped well. A gate structure is disposed on the substrate between the drain region and the source region.

In an embodiment of the invention, an electrostatic discharge device includes a deep doped well of a first conductive type, disposed in a substrate. A first drain doped well of the first conductive type is disposed in the deep doped well. A second drain doped well of the first conductive type is disposed in the first drain doped well. An inserted doping well of a second conductive type is disposed in the first and second drain doped wells, in contact with the deep doped well. A drain region of the first conductive type is in the second drain doped well and above the inserted doping well. An inserted drain of the second conductive type is on the inserted doping well and surrounded by the drain region. A source base well of the second conductive type is disposed in the deep doped well. A source region is disposed in the source base well. A gate structure is disposed on the substrate between the drain region and the source region.

In an embodiment of the invention, the inserted drain comprises a single region or a plurality of regions distributed within the drain region.

In an embodiment of the invention, the inserted drain contacts with the drain region.

In an embodiment of the invention, the inserted drain separates from the drain region by a portion of the inserted doping well.

In an embodiment of the invention, the inserted drain separates from the drain region by an isolation structure in the inserted doping well.

In an embodiment of the invention, the source region comprises a first surface doped region of the first conductive type and a second surface doped region of the second conductive type.

In an embodiment of the invention, the gate structure, the first surface doped region and the second surface doped region are connected to a cathode terminal.

In an embodiment of the invention, at least one of the drain region and the inserted drain is connected to an anode electrode.

In an embodiment of the invention, a sidewall of the inserted doping well contacts with the drain region.

In an embodiment of the invention, the first conductive type is N type and the second conductive type is P type; or the first conductive type is P type and the second conductive type is N type.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3A is a cross-sectional view, schematically illustrating an ESD device, according to an embodiment of the invention.

FIG. 3B is a drawing, schematically the equivalent circuit in FIG. 3A.

DESCRIPTION OF THE EMBODIMENTS

Figure 1:
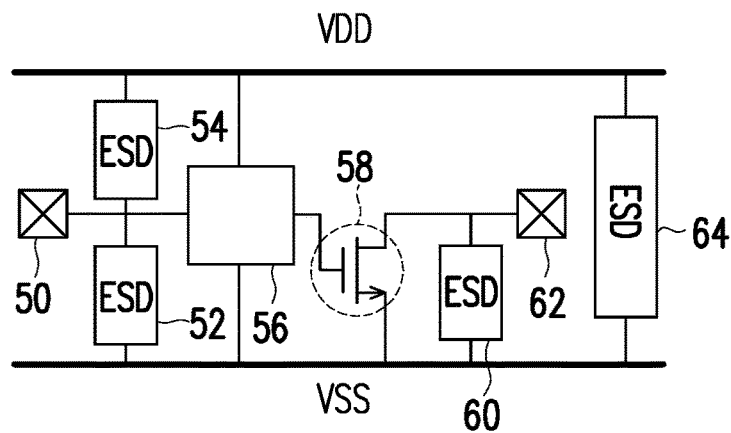
FIG. 1 is a circuit diagram, schematically illustrating an integrated circuit with ESD devices.

Reference will now be made in detail to the present preferred embodiments of the invention, examples of which are illustrated in the accompanying drawings. Wherever possible, the same reference numbers are used in the drawings and the description to refer to the same or like parts.

To at least improve the performance of the ESD device, in which the trigger voltage of ESD device is further reduced, and an additional discharging path is created in the ESD device, the doping structure is modified.

Several embodiments are provided for describing the invention but the invention is not limited to the embodiments as provided. Further, any proper combination between the embodiments can be allowed to form another embodiment.

FIG. 1 is a circuit diagram, schematically illustrating an integrated circuit with ESD devices. Referring to FIG. 1, the invention has looked into the performance of the usual ESD device in the integrated circuit and at least addresses a fail issue in the usual ESD device.

The integrated circuit has the internal circuit 56 to perform the intended function as designed for operation of the electronic apparatus. The internal circuit 56 is operated between a high system power source VDD and a low system power source VSS. The internal circuit 56 also has an input terminal 50 and an output terminal 62. In addition, an output driver 58, such as a MOS device, may be coupled between the internal circuit 56 and the output terminal 60. Several ESD devices 52, 54 are connected between the input terminal 50 and the high/low system power sources VDD/VSS. Further, an ESD device 60 is connected between the output terminal 62 and the system power source VSS. Even further, an ESD device 64 is connected between the system power source VDD and the system power source VSS.

An issue in the above circuit as an example is that the operation voltage range of the output driver 58 may be lower than the trigger voltage of the ESD device 60 in a usual design, in which the ESD device 60 takes the one with usual design. Then, the ESD device 60 would get fail to protect the internal circuit 56 because the ESD device 60 may be not triggered on while the output driver 58 and the internal circuit 56 is damaged by the ESD current.

The invention has proposed an ESD device, which can at least reduce the trigger voltage of the ESD device to be lower than the operation voltage range of the output driver 58. As a result, the ESD device can be triggered first before the ESD enters the output driver 58 and the internal circuit 56. As a result, the ESD current can be led to the ground as an example. The ESD protection capability can be effectively improved to protect those circuits with low operation voltage level.

Figure 2A:
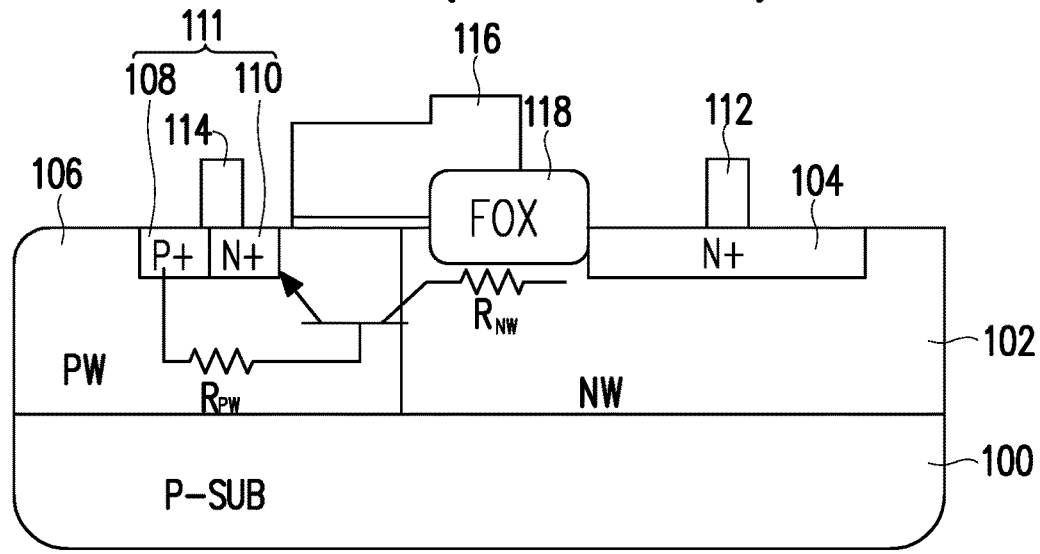
FIG. 2A is a cross-sectional view, schematically illustrating an issue for a usual ESD device investigated by the invention.

FIG. 2A is a cross-sectional view, schematically illustrating an issue for a usual ESD device investigated by the invention. Referring to FIG. 2A, a basic structure of an ESD device considered by the invention is described. A substrate 100 such as a p-type substrate (P-SUB) is provided as a base. Various doped regions would be formed in the substrate 100 to have the ESD device. In the example, a doped well of N-type (NW) 102 and a doped well of P-type (PW) 106 are formed in the substrate 100. A drain region of N-type (N+) 104 is formed in the doped well of N-type (NW) 102. A source region 111, including a first sub-source of P-type 108 and a second sub-source of N-type 110, is formed in the doped well of P-type (PW) 106. An isolation structure 118, such as field oxide (FOX) can be formed on a substrate surface of the substrate 100 in the doped well of N-type (NW) 102. A gate structure 116 is formed on the substrate 100 between the drain region 104 and the source region 111.

Figure 2B:
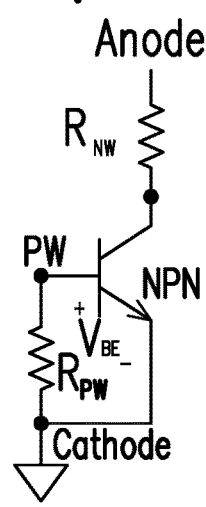
FIG. 2B is a drawing, schematically the equivalent circuit in FIG. 2A.

FIG. 2B is a drawing, schematically the equivalent circuit in FIG. 2A. Referring to FIG. 2A and FIG. 2B, the drain region 104 is connected to the anode by the contact 112, and the source region 111 is connected to the cathode by the contact 114. As a result, an NPN transistor is formed between the anode and the cathode while the resistor $R_{NW}$ and the resistor $R_{PW}$ are also respectively formed in connection to the anode and the cathode. This ESD device with the NPN transistor and the resistor $R_{NW}$ needs a trigger voltage at the anode at a high voltage level, such as 78V. However, the output driver 58 in FIG. 1 usually has lower trigger voltage less than 78V during ESD event. In other words, the trigger level of the ESD device could be higher than the operation voltage range of the output driver. So, the ESD device in FIG. 2A may cause a fail in ESD protection.

Figures 3A, 3B:
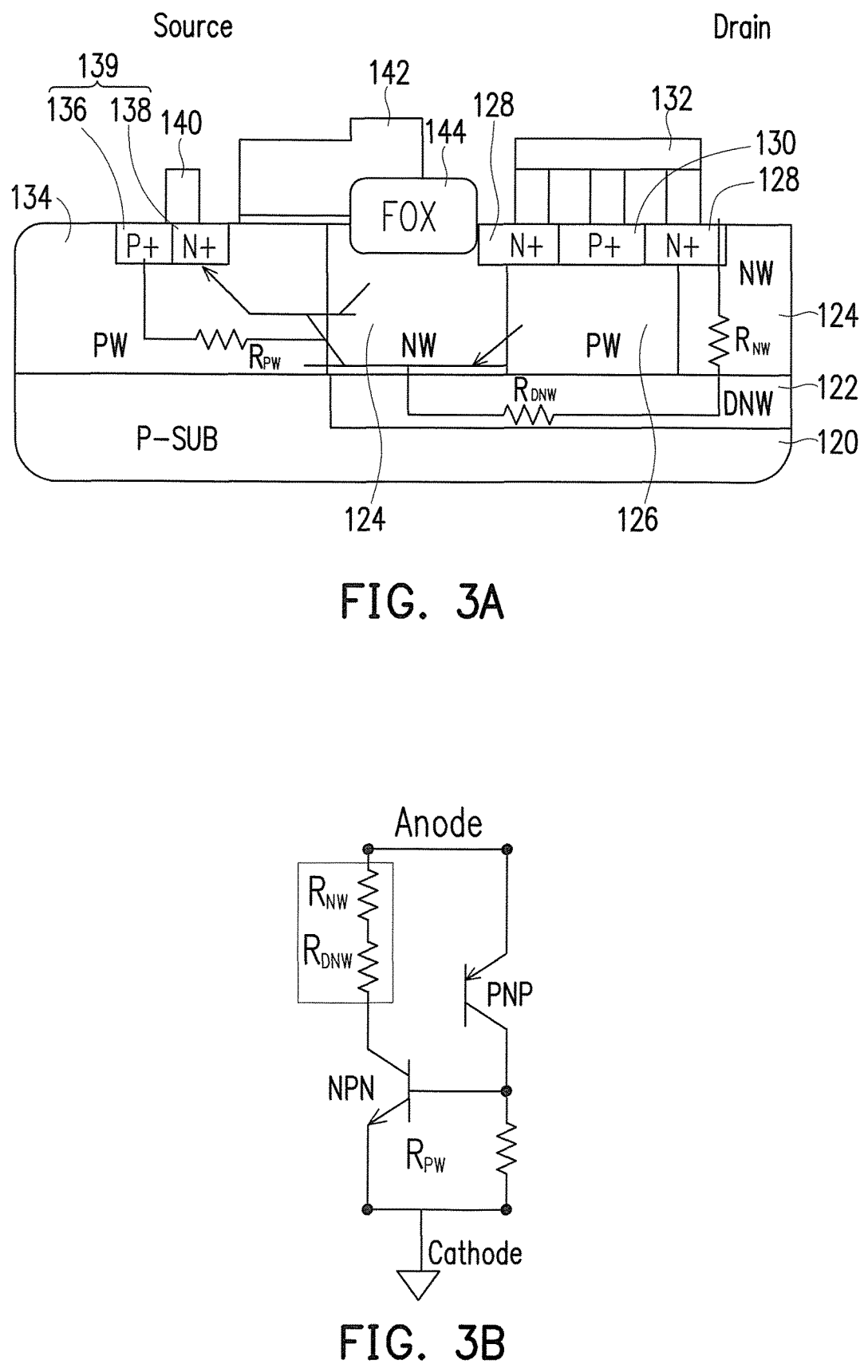

The invention has further looked into the ESD structure and proposed an ESD device by modifying the ESD device in FIG. 2A. FIG. 3A is a cross-sectional view, schematically illustrating an ESD device, according to an embodiment of the invention.

Referring to FIG. 3A, an electrostatic discharge device includes a substrate 120. The substrate 120 can be a P-type substrate (P-SUB) as usually taken. A deep doped well (DNW) 122 of a first conductive type, such as N-type, is disposed in the substrate 120. A drain doped well (NW) 124 of the first conductive type is disposed in the substrate 120 above the deep doped well (DNW) 122. An inserted doping well (PW) 126 of a second conductive type, such as P-type, is disposed in the drain doped well (NW) 124, in contact with the deep doped well (DNW) 122. Here, the deep doped well (DNW) 122 is to cover the inserted doping well (PW) 126 to separate from the substrate 120 and then additionally produce a resistor $R_{DNW}$. A drain region (N+) 128 of N-type is in the drain doped well (NW) 124 and above the inserted doping well (PW) 126. An inserted drain (P+) 130 of P-type is on the inserted doping well (PW) 126 and surrounded by the drain region (N+) 128. In this embodiment, the drain region (N+) 128 and the inserted drain (P+) 130 may be connected together to an anode by the contact 132. However, the invention is not limited the embodiment. Other options as to be shown in FIG. 9A to FIG. 9D can be taken as the examples.

Further, a source doped well (PW) 134 of P-type is disposed in the substrate 120, abut the drain doped well (NW) 124. A source region 139 is disposed in the source doped well (PW) 134. The source region 139 may include a first sub-source (P+) 136 of P-type and a second sub-source (N+) 138 of N-type, which are connected together to a cathode by the contact 140. A gate structure 142 is disposed on the substrate 120 between the drain region 128 and the source region 139. An isolation structure 144, such as field oxide (FOX) or a shallow trench isolation (STI), may be formed on the substrate 120 within the drain doped well (NW) 124. The isolation structure 144 can have the isolation capability in high voltage operation.

FIG. 3B is a drawing, schematically the equivalent circuit in FIG. 3A. Referring to FIG. 3A and FIG. 3B, the equivalent circuit as created further include the PNP transistor and the resistor chain as indicated from the two resistors $R_{NW}$, $R_{DNW}$. From the operation of the ESD circuit, the resistance from the two resistors $R_{NW}$, $R_{DNW}$ is significantly increased. According to the physical law of V=I·R, when the resistance is increase, it easily picks up a small amount of current to produce a sufficiently large bias between the emitter and the base of the PNP transistor. Once the PNP transistor is triggered on, the NPN transistor in the ESD circuit is then easily triggered up as well, due to chain effect. As a result, the trigger voltage of the ESD device is effectively reduced.

Figure 4A:
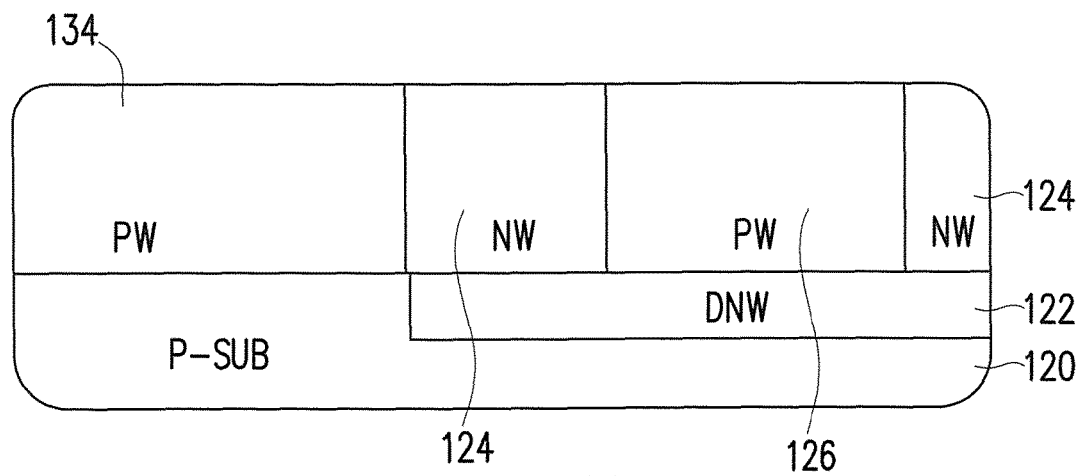
FIG. 4A to FIG. 4C are cross-sectional views, schematically illustrating the doping procedure to fabricate the ESD device, according to an embodiment of the invention.
Figure 4B:
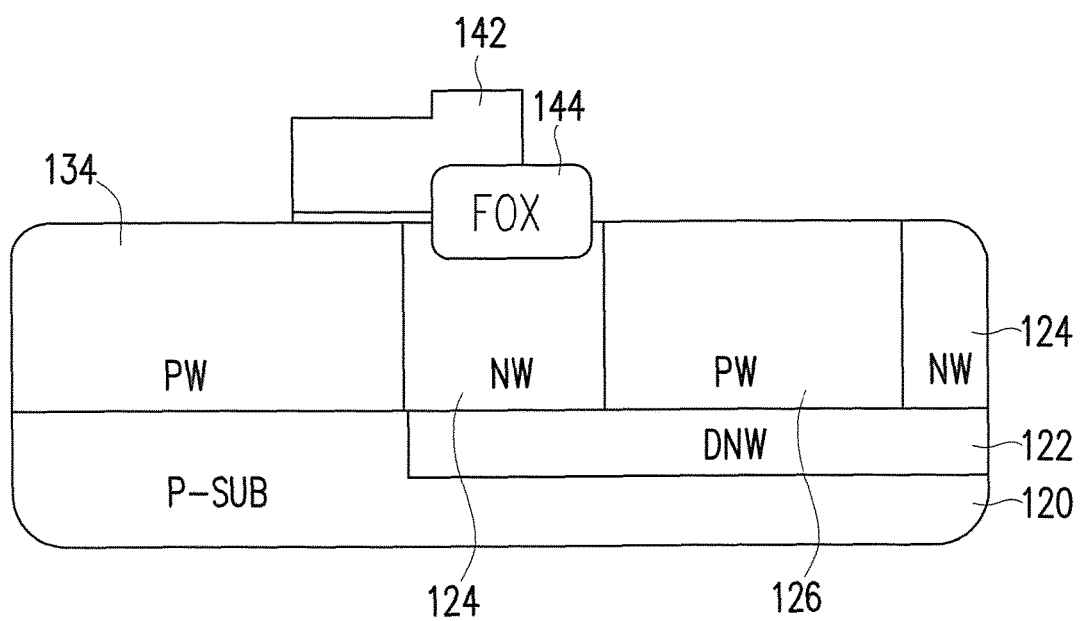
Figure 4C:
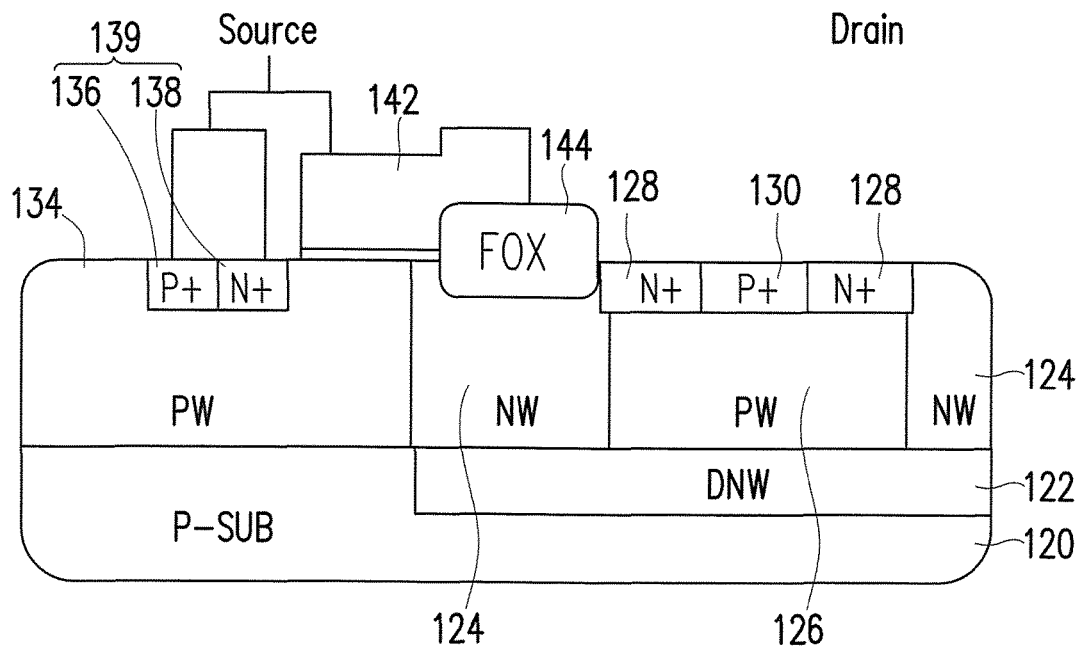

FIG. 4A to FIG. 4C are cross-sectional views, schematically illustrating the doping procedure to fabricate the ESD device, according to an embodiment of the invention. Referring to FIG. 4A, the P-type substrate 120 is taken as the base for forming the ESD device. The deep doped well (DNW) 122 is formed in the substrate 122 at the predetermined depth. Referring to FIG. 4B, the drain doped well (NW) 124 is formed by doping the substrate 120 at the region above the deep doped well (DNW) 122. However, a region reserved to be formed as the inserted doping well (PW) 126 is not doped by N-type dopants. Then, the P-type doping procedure is performed to form the inserted doping well (PW) 126, which is surrounded by the drain doped well (NW) 124 is also covered by the deep doped well (DNW) 122 at the bottom, so to separate from the substrate 120. In addition, the source doped well (PW) 134 abut the drain doped well (NW) 124 is also formed, at the same doping procedure as an example. However, the source doped well (PW) 134 and the inserted doping well (PW) 126 may be formed at different doping procedure.

Referring to FIG. 4B, the isolation structure 144, such as the FOX can is formed on the substrate 120 within the drain doped well (NW) 124. The isolation structure 144 as an option to be included can improve the isolation capability when the ESD device is operated in high voltage circuit. Further, the gate structure 142 is formed on the substrate 120 and covers a portion of the isolation structure 144. Referring to FIG. 4C, at one side of the gate structure 142, the drain region (N+) 128 and the inserted drain (P+) 130 are formed on the surface of the substrate 120 within the drain doped well (NW) 124 and above the inserted drain (P+) 130. At another side of the gate structure 142, the source region 139 including the first sub-source 136 and the second sub-source 138 are formed within the source doped well (PW) 134. The gate structure 142, the first sub-source 136 and the second sub-source 138 in an example can be connected to the cathode.

Figure 5:
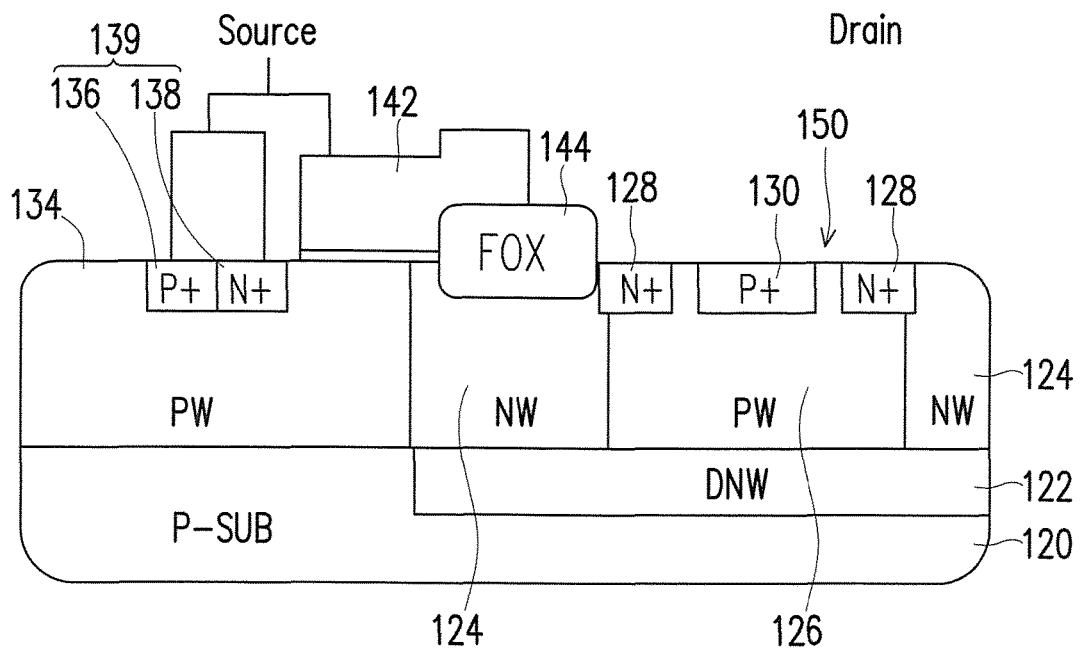
FIG. 5 is a cross-sectional view, schematically illustrating an ESD device, according to an embodiment of the invention.

FIG. 5 is a cross-sectional view, schematically illustrating an ESD device, according to an embodiment of the invention. Referring to FIG. 5, a further modification to the ESD device is the drain structure. In an embodiment, the inserted drain (P+) 130 can be separate from the drain region (N+) 128 by a separation 150 without contact to each other. The separation 150 can be contributed from a part of the inserted doping well (PW) 126.

Figure 6:
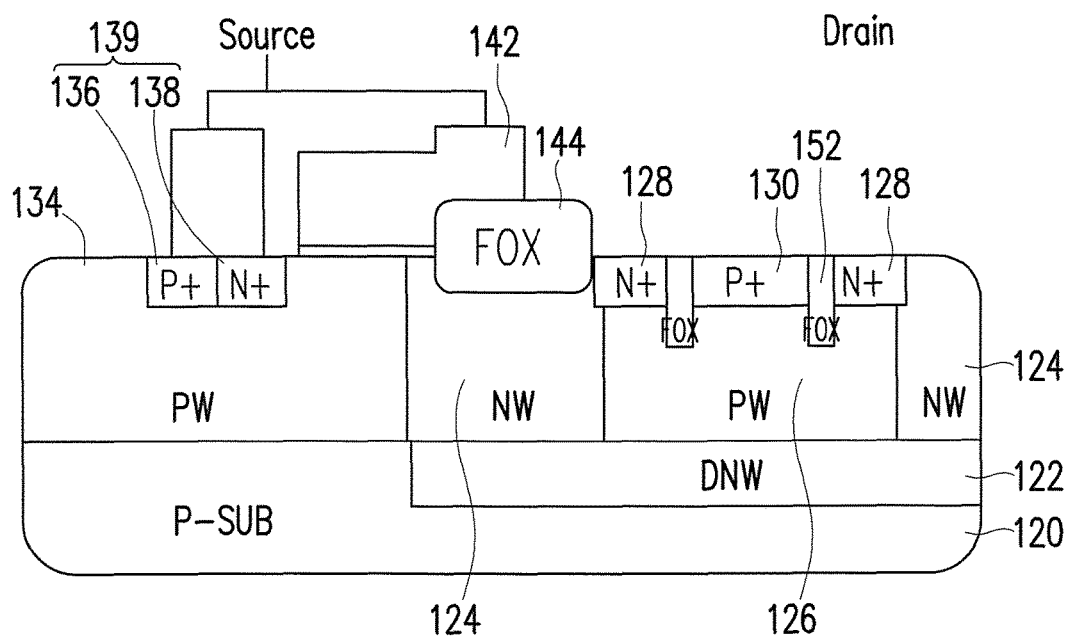
FIG. 6 is a cross-sectional view, schematically illustrating an ESD device, according to an embodiment of the invention.

FIG. 6 is a cross-sectional view, schematically illustrating an ESD device, according to an embodiment of the invention. With the similar feature as addressed in FIG. 5, a further modification may be done by physically forming the isolation structure 152 between the inserted drain (P+) 130 and the drain region (N+) 128. The isolation structure 152 in an example can be FOX structure or STI structure.

Figures 7A, 7B, 7C:
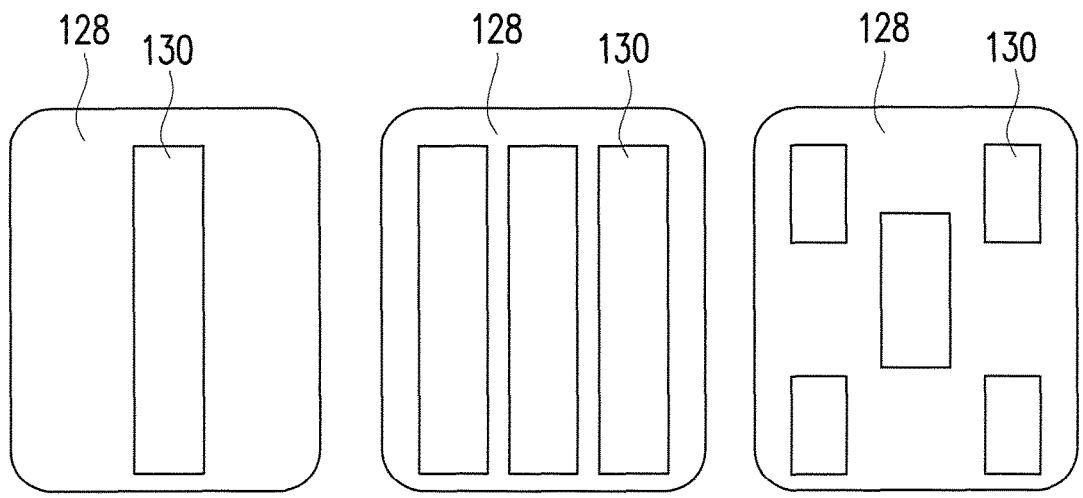
FIG. 7A to FIG. 7C are top views, schematically illustrating the distribution of the inserted drain in the drain region, according to several embodiments of the invention.

As to further modifications, FIG. 7A to FIG. 7C are top views, schematically illustrating the distribution of the inserted drain in the drain region, according to several embodiments of the invention. The layout of the inserted drain (P+) 130 within the drain region (N+) 128 may have various options. Multiple embodiments would be provided as the examples, but the invention is not just limited to the embodiments.

Referring to FIG. 7A, the inserted drain (P+) 130 can be a single region, such as a straight bar, located at the center part of the drain region (N+) 128, which may be a rectangular shape. Referring to 7B, alternatively, the inserted drain (P+) 130 can be formed from multiple regions instead of the single region in FIG. 7A. In the example, multiple straight bars can be taken as evenly distributed within the drain region (N+) 128. Further referring to FIG. 7C, the multiple regions of the inserted drain (P+) 130 can be short bars, evenly distributed within the drain region (N+) 128. However, the invention is not limited to the embodiments.

Figure 8:
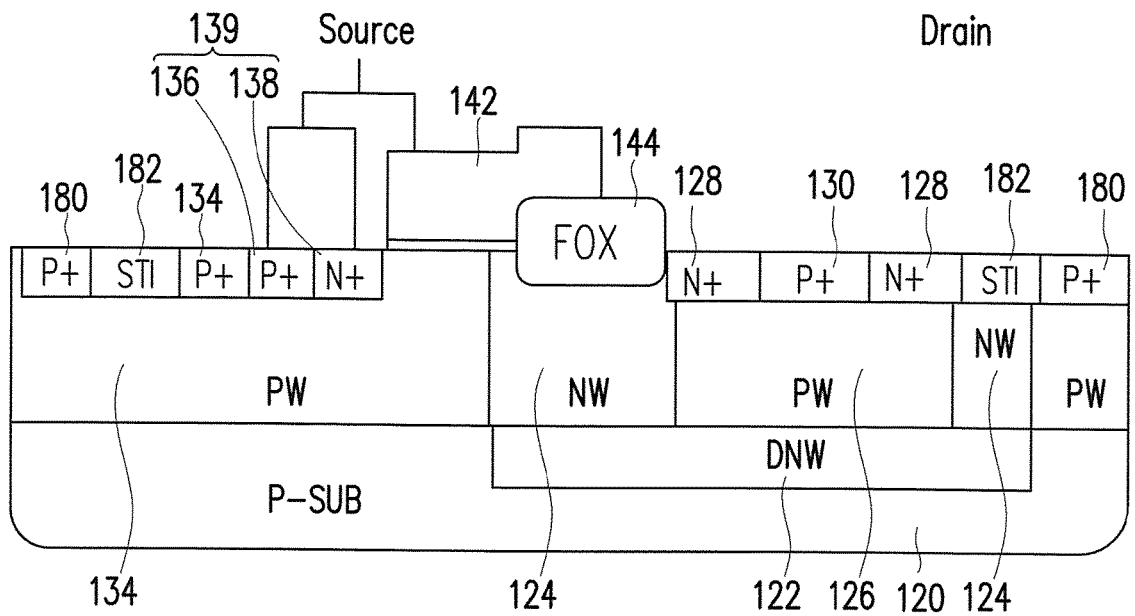
FIG. 8 is a drawing, schematically illustrating a cross-sectional view and a top view of the ESD device, according to an embodiment of the invention.
Figure 8:
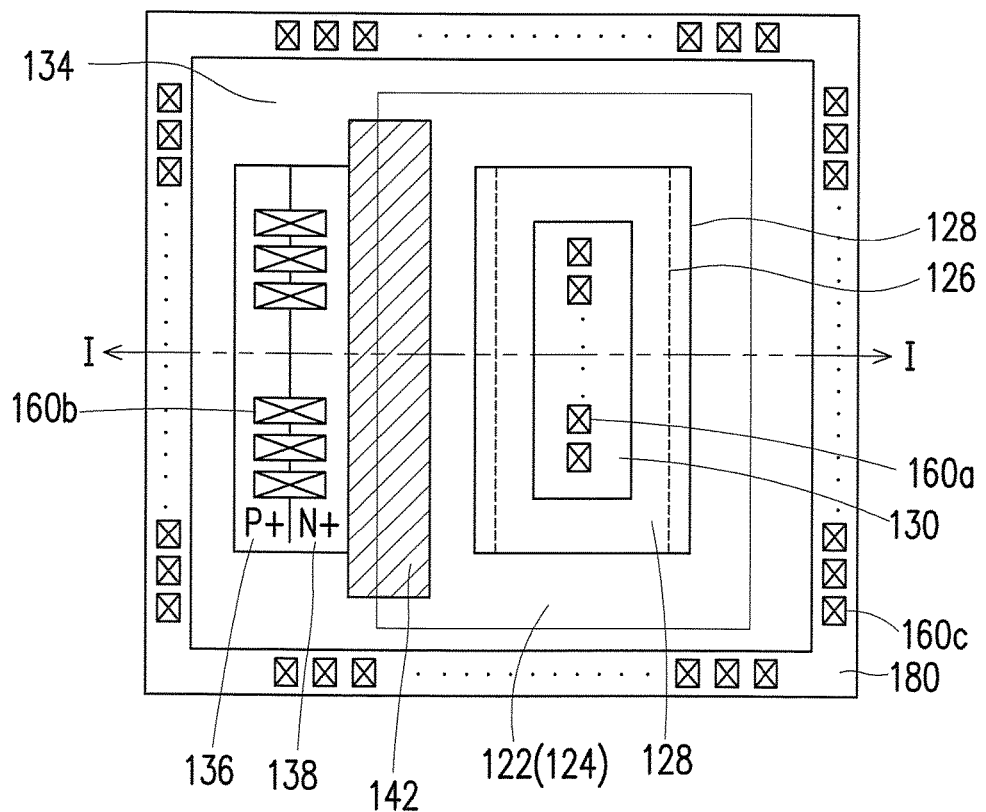

FIG. 8 is a drawing, schematically illustrating a cross-sectional view and a top view of the ESD device, according to an embodiment of the invention. Referring to FIG. 8, the top view of the ESD in accordance with the cross-sectional view as cut at the line I-I is further shown in better detail. In this structure, the P+ guard ring 180 is additionally shown. The isolation structure 182, such as FOX or STI, is also formed on the substrate 120 between the ESD device and the guard ring 180. As noted, the guard ring 180 is the external structure from the ESD device, used to supply the proper voltage to the substrate. The ESD device as proposed in the invention is not limited to the external structure, such as the guard ring 180, which can be modified according to the practical application. The embodiment is just an example to show the later applications in actual design. In addition, various contacts 160a, 160b, 160c, as usually known in the art, are formed to connect the designated doped regions for supply the designated voltage.

FIG. 9A to FIG. 9D are drawings, schematically illustrating the cross-sectional views of ESD device, which is connected to the source terminal and the drain terminal, according to several embodiments of the invention. Several embodiments for the manners to connect to the anode and the cathode are provided as the illustration. However, the invention is not limited to the embodiments.

Figure 9A:
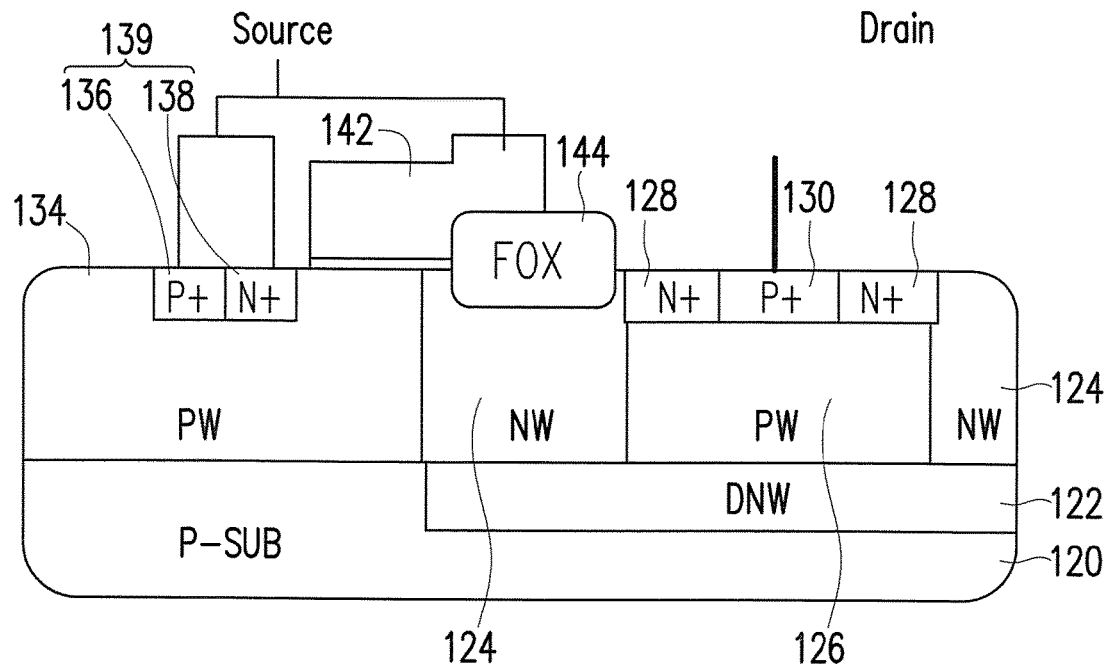
FIG. 9A to FIG. 9D are drawings, schematically illustrating the cross-sectional views of ESD device, which is connected to the source terminal and the drain terminal, according to several embodiments of the invention.
Figure 9B:
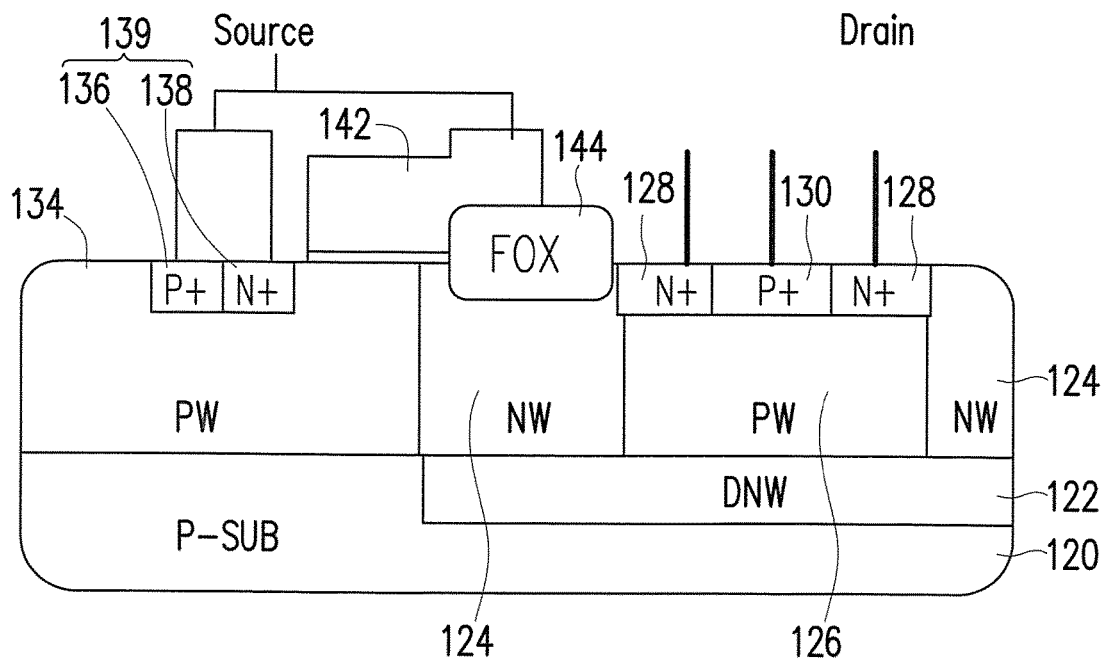
Figure 9C:
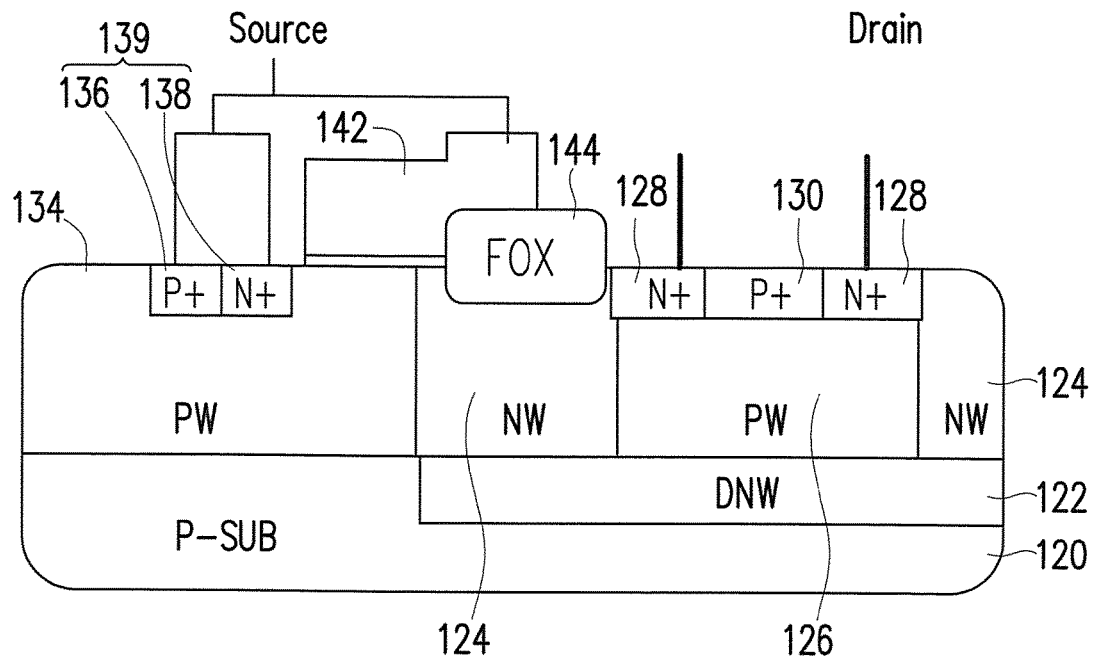
Figure 9D:
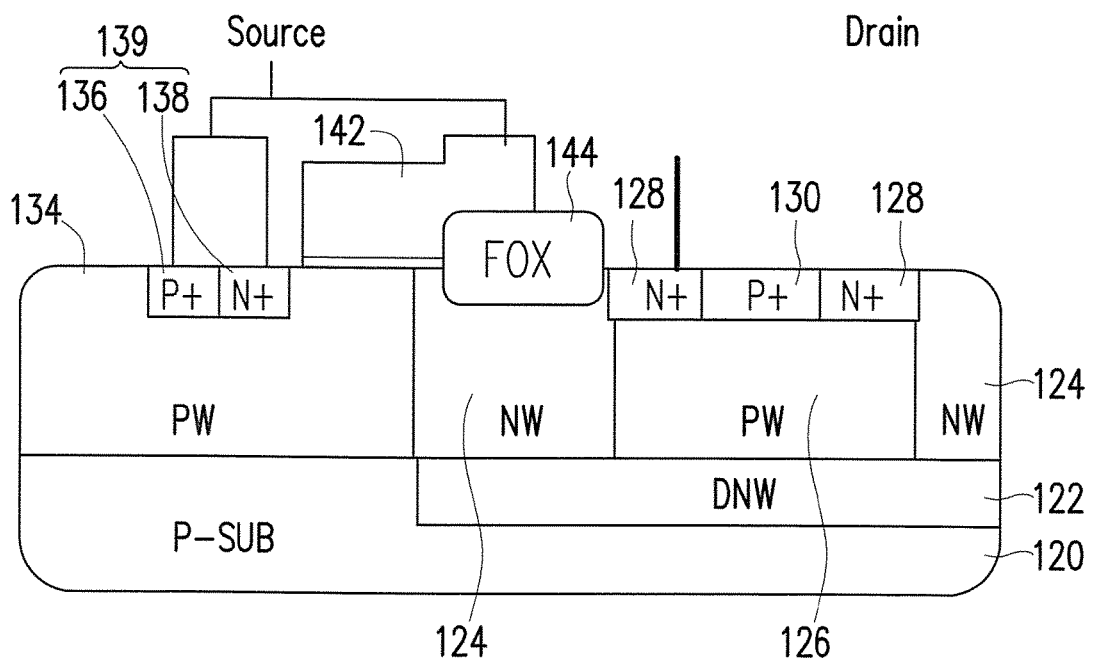

Referring to FIG. 9A, as to the drain region, in an embodiment, only the inserted drain (P+) 130 in the drain region 128 is coupled to the anode terminal. The gate structure 142 and the source region 111 are coupled together to the cathode terminal. Referring to FIG. 9B in an alternative option, both the drain region 128 and the inserted drain 130 are coupled together to the anode. Further referring to FIG. 9C, only the drain region 128 is coupled to the anode, in which the anode contacts may evenly surround the inserted drain 130. Further referring to FIG. 9D in this embodiment, only the drain region 128 is coupled to the anode but the anode contacts may not evenly surround the inserted drain 130. However, the invention is not limited to the embodiments.

Figure 10:
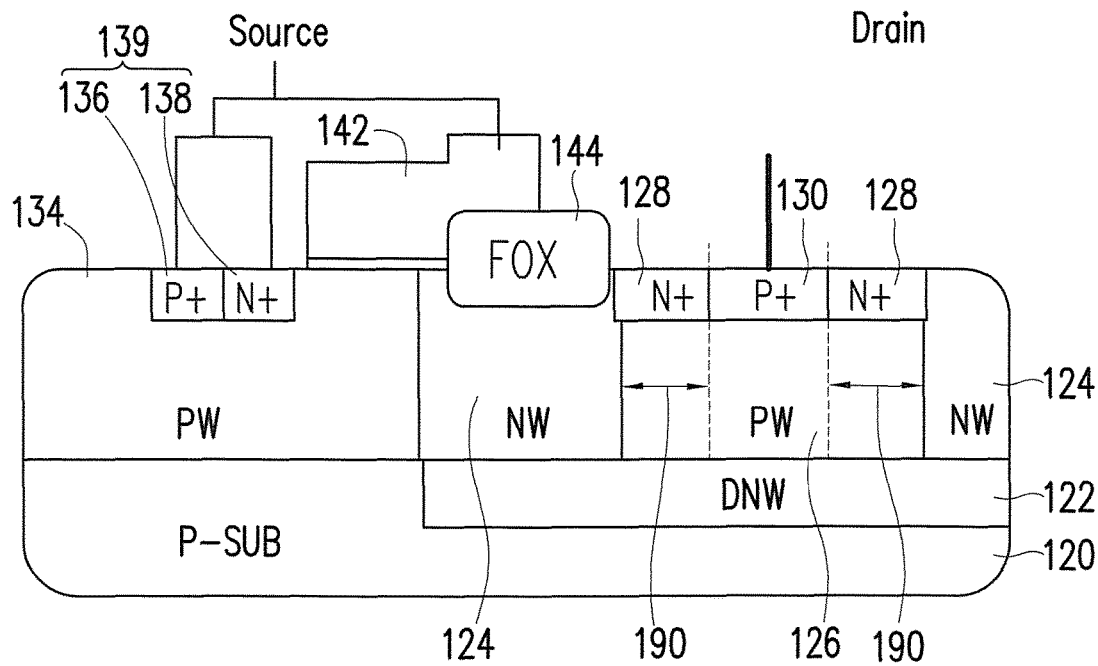
FIG. 10 is a drawing, schematically illustrating a cross-sectional view of ESD device, according to an embodiment of the invention.

FIG. 10 is a drawing, schematically illustrating a cross-sectional view of ESD device, according to an embodiment of the invention. Referring to FIG. 10, the drain doped well (NW) 124 needs to contact the drain region (N+) 128 and the inserted doping well (PW) 126 needs to contact the inserted drain 130. So, the interface between the drain doped well (NW) 124 and the inserted doping well (PW) 126 can be located within the range 190 between the inner edge and the outer edge of the drain region (N+) 128.

The invention with the same inventive concept can also be applied to other type of ESD device, such as field-drift metal-oxide-semiconductor (FDMOS) transistor, double diffused drain metal-oxide-semiconductor (DDDMOS) transistor, lateral diffusion N-type metal-oxide-semiconductor (LDNMOS) transistor, and so on.

Figure 11:
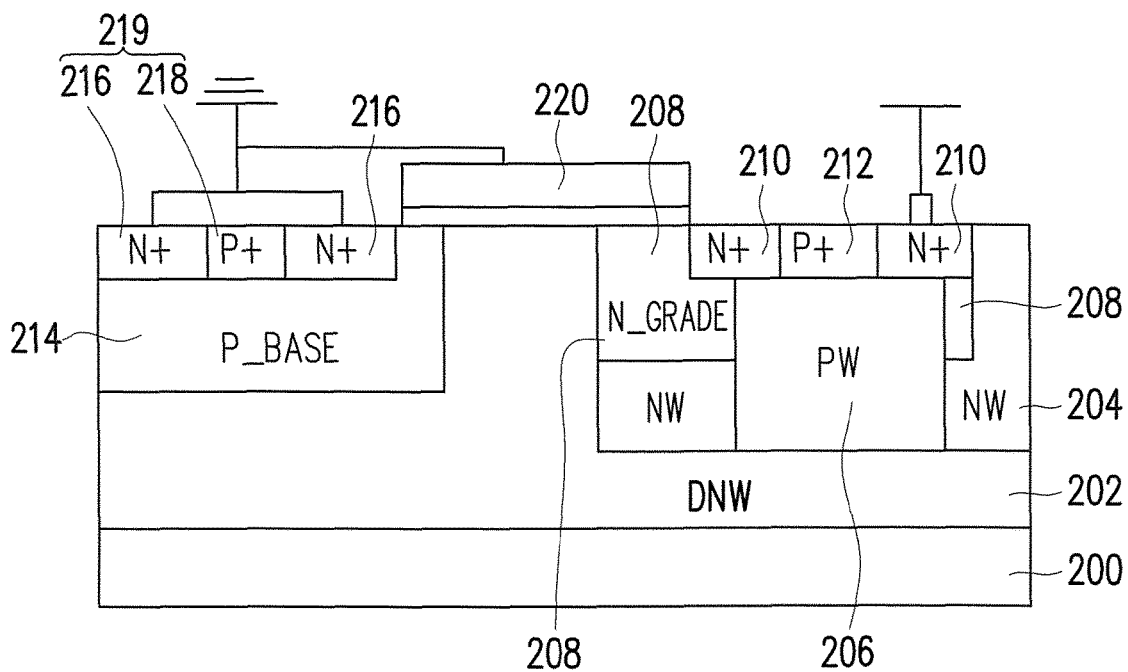
FIG. 11 is a drawing, schematically illustrating a cross-sectional view of ESD device, according to an embodiment of the invention.

FIG. 11 is a drawing, schematically illustrating a cross-sectional view of ESD device, according to an embodiment of the invention. Referring to FIG. 11, the ESD device is shown by the structure based on LDNMOS, as an example. The substrate 200 serves as the base. A deep doped well (DNW) 202 of a first conductive type, such as N-type, is disposed in the substrate 200. A first drain doped well (NW) 204 of the first conductive type is disposed in the deep doped well (DNW) 202. A second drain doped well (N_GRADE) 208 of the first conductive type is disposed in the first drain doped well (NW) 204. In an example, the second drain doped well 208 in impurity concentration can be higher than the first drain doped well 204 but lower than the drain region (N+) 210 (to be described later) to form a gradient distribution in concentration from the drain region (N+) 210 to the first drain doped well (NW) 204 and then to the deep doped well (DNW) 202. An inserted doping well (PW) 206 of a second conductive type, such as P-type, is disposed in the first and second drain doped wells 204, 208, in contact with the deep doped well (DNW) 202. A drain region (N+) 210 of the first conductive type, in the second drain doped well (N_GRADE) 208 and above the inserted doping well (PW) 206. An inserted drain (P+) 212 of the second conductive type is on the inserted doping well (PW) 206 and surrounded by the drain region (N+) 210. A source base well (P_BASE) 214 of the second conductive type is disposed in the deep doped well (DNW) 202. A source region (P+, N+) 219 is disposed in the source base well 214. Here, the source region 219 includes the first sub-source of N-type (N+) 216 and the second sub-source of P-type (P+) 218. A gate structure 220, such as poly gate, is disposed on the substrate 200 between the drain region 210 and the source region 219.

For the actual application in circuit as an example, the drain region is coupled to the anode terminal while the source region 219 and the gate structure 220 together are coupled to the cathode terminal. However, as shown in FIG. 9A to FIG. 9D, the coupling manner can have various options without limitation. Also, the layer out of the inserted drain (P+) 212 is also shown in FIG. 5 to FIG. 7C as the option in examples.

Figure 12:
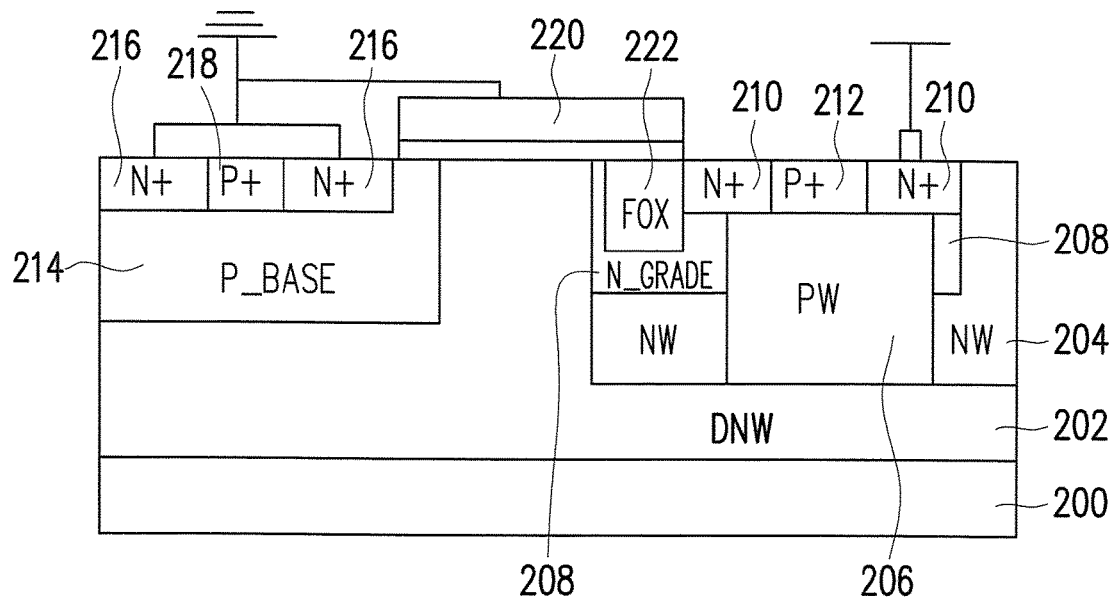
FIG. 12 is a drawing, schematically illustrating a cross-sectional view of ESD device, according to an embodiment of the invention.

FIG. 12 is a drawing, schematically illustrating a cross-sectional view of ESD device, according to an embodiment of the invention. Referring to FIG. 12, similar to FIG. 11, the ESD device is also based on LDNMOS as shown in FIG. 11 but the embodiment in FIG. 12 further includes the isolation structure 222 under the gate structure 220. The isolation structure 222 can be FOX structure or STI structure.

Figure 13:
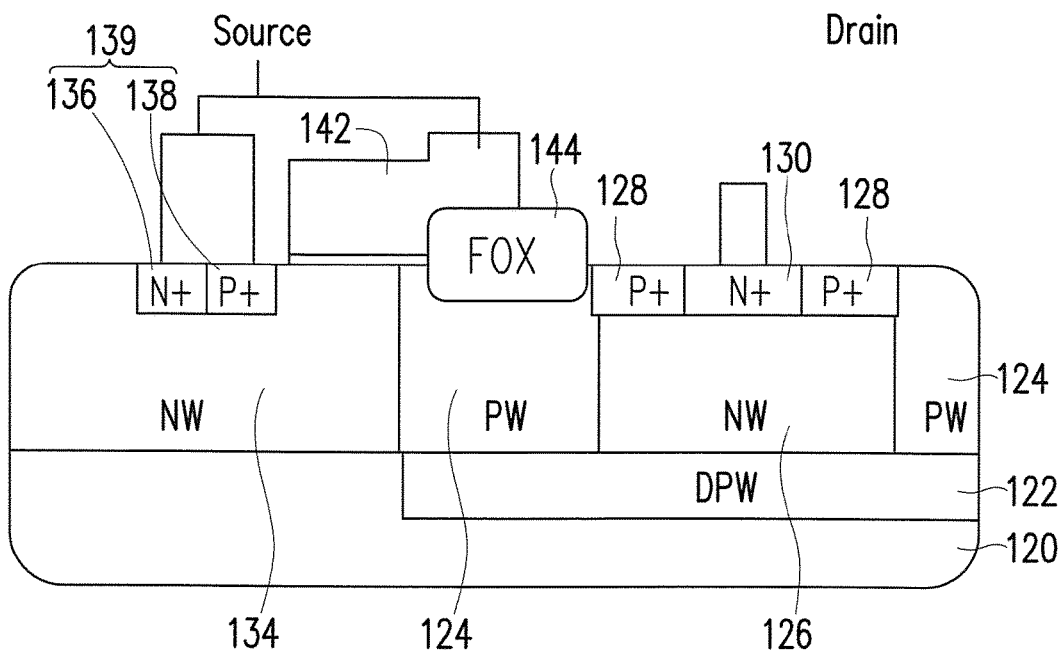
FIG. 13 is a drawing, schematically illustrating a cross-sectional view of ESD device, according to an embodiment of the invention.

FIG. 13 is a drawing, schematically illustrating a cross-sectional view of ESD device, according to an embodiment of the invention. Referring to FIG. 13, the structure of the ESD device in FIG. 13 is similar to the structure of ESD device in FIG. 4C. However, the first conductive type and the second conductive type in the foregoing ESD device can be interchanged. In the foregoing embodiment, the first conductive type is set to N-type, and the second conductive type is set to P-type. In this embodiment of FIG. 13, the first conductive type is set to P-type, and the second conductive type is set to N-type for the ESD device. In addition, the P+ guard ring in FIG. 8 can also be accordingly adapted into FIG. 13 but not shown. The external structure part other than the ESD device can be modified according to the actual applications or designs.

As to the ESD device based on NMOS in an example, the invention has proposed a modification by adding the deep N-type doped well (NDW), the insert P-type well (PW), and the inserted drain (P+). The equivalent circuit can create an additional PNP transistor with the increased resistance between the emitter terminal and the base terminal. The PNP transistor is more sensitive to the current due to the larger resistance, and then is easily triggered on. The chain effect would further cause the NPN transistor to be turned on. As a result, the trigger voltage of the ESD device can be effectively reduced. The ESD device thereby can more effectively protect the internal circuit and the output driver.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge (ESD) device, comprising:
   a substrate;
   a deep doped well of a first conductive type, disposed in the substrate;
   a drain doped well of the first conductive type, disposed in the substrate above the deep doped well;
   an inserted doping well of a second conductive type, disposed in the drain doped well, in contact with the deep doped well;
   a drain region of the first conductive type, in the drain doped well (NW) and above the inserted doping well;
   an inserted drain of the second conductive type, on the inserted doping well and surrounded by the drain region;
   a source doped well of the second conductive type, disposed in the substrate, abut the drain doped well;
   a source region, disposed in the source doped well; and
   a gate structure, disposed on the substrate between the drain region and the source region.

2. The ESD device of claim 1, wherein the inserted drain comprises a single region or a plurality of regions distributed within the drain region.

3. The ESD device of claim 1, wherein the inserted drain contacts with the drain region.

4. The ESD device of claim 1, wherein the inserted drain separates from the drain region by a portion of the inserted doping well.

5. The ESD device of claim 1, wherein the inserted drain separates from the drain region by an isolation structure in the inserted doping well.

6. The ESD device of claim 1, wherein the source region comprises a first surface doped region of the first conductive type and a second surface doped region of the second conductive type.

7. The ESD device of claim 6, wherein the gate structure, the first surface doped region and the second surface doped region are connected to a cathode terminal.

8. The ESD device of claim 1, wherein at least one of the drain region and the inserted drain is connected to an anode electrode.

9. The ESD device of claim 1, wherein a sidewall of the inserted doping well contacts with the drain region.

10. The ESD device of claim 1, wherein the first conductive type is N type and the second conductive type is P type; or the first conductive type is P type and the second conductive type is N type.

11. An electrostatic discharge (ESD) device, comprising:
a deep doped well of a first conductive type, disposed in a substrate;
a first drain doped well of the first conductive type, disposed in the deep doped well;
a second drain doped well of the first conductive type, disposed in the first drain doped well;
an inserted doping well of a second conductive type, disposed in the first and second drain doped wells, in contact with the deep doped well;
a drain region of the first conductive type, in the second drain doped well and above the inserted doping well;
an inserted drain of the second conductive type, on the inserted doping well and surrounded by the drain region;
a source base well of the second conductive type, disposed in the deep doped well;
a source region, disposed in the source base well; and
a gate structure, disposed on the substrate between the drain region and the source region.

12. The ESD device of claim 11, wherein the inserted drain comprises a single region or a plurality of regions distributed within the drain region.

13. The ESD device of claim 11, wherein the inserted drain contacts with the drain region.

14. The ESD device of claim 11, wherein the source region comprises a first surface doped region of the first conductive type and a second surface doped region of the second conductive type.

15. The ESD device of claim 14, wherein the gate structure, the first surface doped region and the second surface doped region are connected to a cathode terminal.

16. The ESD device of claim 11, wherein at least one of the drain region and the inserted drain is connected to an anode electrode.

17. The ESD device of claim 11, wherein a sidewall of the inserted doping well is located under the drain region and contacting a bottom of the drain region.

18. The ESD device of claim 11, wherein the first conductive type is N type and the second conductive type is P type; or the first conductive type is P type and the second conductive type is N type.

* * * * *